United States Patent [19]

Fazlin

[11] Patent Number: 4,623,441

[45] Date of Patent: Nov. 18, 1986

[54] PAIRED ELECTRODES FOR PLASMA CHAMBERS

[75] Inventor: Fazal A. Fazlin, St. Petersburg, Fla.

[73] Assignee: Advanced Plasma Systems Inc., St. Petersburg, Fla.

[21] Appl. No.: 641,164

[22] Filed: Aug. 15, 1984

[51] Int. Cl.$^4$ .................. C23C 15/00; C23F 1/00
[52] U.S. Cl. .................. 204/298; 156/345; 156/643; 204/192.12; 204/192.32
[58] Field of Search .......... 204/192 R, 192 E, 192 C, 204/192 SP, 298; 156/345, 643; 250/531; 134/1

[56] References Cited

U.S. PATENT DOCUMENTS

| | | | |
|---|---|---|---|
| 4,264,393 | 4/1981 | Gorin et al. | 204/298 |
| 4,279,216 | 7/1981 | Buhl et al. | 204/298 |
| 4,287,851 | 9/1981 | Dozier | 204/298 |
| 4,289,598 | 9/1981 | Engle | 204/298 |
| 4,292,153 | 9/1981 | Kudo et al. | 204/298 |
| 4,328,081 | 5/1982 | Fazlin | 204/192 E |
| 4,381,965 | 5/1983 | Maher, Jr. et al. | 204/298 |
| 4,424,096 | 1/1984 | Kumagai | 204/298 |
| 4,425,210 | 1/1984 | Fazlin | 204/298 |
| 4,461,239 | 7/1984 | Cannella et al. | 204/298 |
| 4,496,420 | 1/1985 | Frohlich et al. | 204/298 |

*Primary Examiner*—John F. Niebling
*Assistant Examiner*—Terryence Chapman
*Attorney, Agent, or Firm*—Stein, Reese & Prescott

[57] ABSTRACT

A paired electrode for use in a plasma chamber. In one embodiment, the paired electrode comprises a plurality of angle members which are disposed parallel to one another. Pairs of the angle members are positioned facing one another, one functioning as a power electrode member and the other as a ground electrode member. All of the power electrode members are rigidly fastened to one another by means of a transverse power bus and all of the ground electrode members are rigidly fastened to one another by means of a transverse ground bus. The power bus and the ground bus are electrically connected to a power source, usually a RF power source and a ground of the plasma chamber, respectively. The plasma chamber contains a plurality of paired electrodes, and objects to be processed by plasma are placed between the paired electrodes.

9 Claims, 5 Drawing Figures

PAIRED ELECTRODES FOR PLASMA CHAMBERS

BACKGROUND OF THE INVENTION

1. Field of the Invention

This invention relates to plasma gas chambers. More particularly, this invention relates plasma gas chambers employing one or more paired electrodes for exciting a gas to a plasma state.

2. Description of the Prior Art

"Plasma" has been defined as matter in an "elevated state". Physical properties of the plasma state are somewhat similar to those in the gaseous state. The flow patterns and characteristics become extremely aggressive in the plasma state, where the gases are essentially in a nascent form. Plasma or these "active species" are created in a region between a pair of RF (radio frequency) electrodes, and are then directed toward the target surface.

Conventional plasma gas chambers include a cylindrical or rectilinear chamber with a front-loading door and either a barrel or planar electrode configuration. The objects to be exposed to the plasma gas are inserted between the electrodes either vertically or horizontally. The gases, generally oxygen ($O_2$) and a carbon tetrafluoride ($CF_4$), are introduced into the chamber to flow between the electrode pair to be excited to a plasma state by the electrical field created between the paired electrodes. The objects are enveloped by the plasma gas and processed according to the desired methods. U.S. Pat. Nos. 4,148,705, 4,230,553, 3,661,747, 4,123,663, 4,148,705, 3,276,106, 3,598,710, 4,287,851, 4,289,598, 4,282,077, 4,012,307, 4,264,393, 4,227,321, 4,285,800, 4,307,283, 4,151,034, 4,033,287, 4,158,589, 4,192,706, 4,198,261, 3,410,774, 3,867,216, 3,705,055, 3,930,913, 4,178,877, 4,026,742, and 4,123,663, British Pat. No. 1,522,059, and French Pat. No. 2,308,200, the disclosure of each of which are incorporated by reference herein, illustrate many configurations of electrode pairs in the treatment of objects such as semiconductor substrates and multi-layer printed circuit boards.

Recently, improved plasma gas chambers have been developed by me comprise a rectilinear main body portion having frustro-pyramidal diffusion chambers on opposing ends thereof. Porous or apertured electrode pairs are positioned transversely in the rectilinear chamber. The gas is introduced into one of the frustro-pyramidal chambers and pulsated back and forth through the apertured electrode pairs from one diffusion chamber to the other. The objects, having been placed between the adjoining electrode pairs, are consequently treated by the plasma gas. Extremely uniform results are obtained because the gas is uniformly excited to a plasma state as it passes through the primary electrical field created by the power and ground electrodes of each electrode pair. The plasma gas thus created is significantly maintained as it flows to the adjoining pair because it is exposed to a secondary electric field created by the power or ground electrode of one electrode pair and the ground or power electrode of the succeeding electrode pair, respectively. U.S. Pat. Nos. 4,425,210 and 4,328,081, the disclosure of each of which is hereby incorporated by reference herein, set forth a more detailed description of this unique plasma gas chamber employing paired electrodes.

My plasma gas chambers have achieved great commercial success in the removal of smear in the holes of multi-layer printed circuit boards. Still more recently, I have used my novel plasma gas chamber, or variations thereof, in the sputtering of a metal onto the inside surface of the holes in printed circuit boards. These plated-through-hole apparati and methods are disclosed in my co-pending applications, Ser. No. 383,311, filed May 28, 1982 and Ser. No. 438,168, filed Apr. 8, 1983, entitled "Plated-Through-Hole Apparatus and Method", the disclosure of each of which is incorporated by reference herein.

In all of my chambers, the electrode pairs consisted of two sheets of aluminum or copper in which was drilled or punched a multiplicity of uniformly dispersed holes. These two sheets of metal were then positioned parallel to one another by means of ceramic stand-offs. One of the sheets was connected to the RF generator to act as a power electrode and the other was connected to the ground of the system to act as the ground electrode.

These electrode pairs have been reasonably sufficient to accomplish the objectives of my previous inventions. However, there has always been a need to increase the rate of plasma desmearing and sputtering to increase the efficiency and throughput of the chambers. Unfortunately, there has always been competing parameters which limit such efficiency and throughput. Specifically, the rate of desmearing and sputtering can be increased by positioning the electrode pairs closer to one another within the chamber. However, this decreases the number of printed circuit boards which may be inserted therebetween, thereby decreasing the throughput. Conversely, while spacing electrode pairs further apart allows more printed circuit boards to be treated, the secondary electrical field created between the adjoining electrode pairs is significantly decreased when operating at the same power level, thereby decreasing the ability to maintain the gas in a plasma state. Increased power levels are usually undesirable since they significantly increase the temperature of the plasma gas within the chamber and, consequently, resulting in overheating of the printed circuit boards. Even without increased power levels, the electrode pairs progressively warped and deformed until eventually they would be discarded and new ones installed.

Therefore, it is an object of this invention to provide an apparatus which overcomes the aforementioned inadequacies of the prior art devices and provides an improvement which is a significant contribution to the advancement of the plasma chamber art.

Another object of this invention is to provide a paired electrode for plasma chambers which function to increase the efficiency and thoroughput of the chamber during operation.

Another object of this invention is to provide a paired electrode for plasma chambers which has a unique construction which can be used in conjunction with existing plasma chambers and which can be easily manufactured at relatively low cost as compared to existing paired electrodes.

Another object of this invention is to provide a paired electrode for plasma chambers which is significantly more durable in construction than that of existing paired electrodes thereby increasing the life of the paired electrodes.

Another object of this invention is to provide a paired electrode for plasma chambers having a construction which precludes warpage or deforming during use throughout its life.

Another object of this invention is to provide a paired electrode for plasma chambers which can be manufactured from stock materials thereby eliminating all difficult machining operations.

The foregoing has outlined some of the more pertinent objects of the invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a unique paired electrode for use in conjunction with plasma chambers. In one embodiment, the paired electrodes of the invention comprises a plurality of angle members which are disposed parallel to one another. Every two of the angle members are positioned facing one another, one functioning as a power electrode member and the other as a ground electrode member. All of the power electrode members and all of the ground electrode members are rigidly fastened to one another by means of a transverse power bus and a transverse ground bus, respectively. The power bus and the ground bus are then, respectively, electrically connected to the power, usually RF, and the ground of the plasma chamber. In the other embodiment, the paired electrodes of the invention comprise a "Z" cross-sectional configuration which are positioned in facing relationship with one another by means of stand-offs and which are electrically connected to the power and ground of the plasma chambers by means of the transverse power and the transverse ground buses. In both of the embodiments, a plurality of the electrode pairs are fastened together in the conventional form by means of longitudinal power and longitudinal ground bus bars interconnecting the power and ground buses of the electrode pairs. The resulting electrode pair assembly is then inserted within the plasma chamber for use.

During use, the objects to be treated, such as printed circuit boards, are inserted into the areas between adjoining electrode pairs. The lid to the chamber is closed and then gas is introduced. As the gas flows from one end of the chamber to the other, the gas weaves through the opposing power and ground electrode members of each electrode pair, is exposed to a primary electric field, and is therefore excited to a plasma state. As the gas continues to flow through or about the object toward the other adjoining electrode pair, the gas is maintained in its excited state by means of the existing secondary electric field between the adjoining electrode pairs.

For reasons somewhat yet unexplainable, the novel electrode pairs of this invention produce a plasma glow which extends not only between the opposing members of each electrode pair (in the primary field), but also almost fully across the secondary field. This degree of excitation of the plasma significantly increases the ability of the plasma to accomplish its intended purpose, i.e. desmearing or sputtering, at conventional power levels. The throughput of the plasma chamber employing my novel electrode pairs is therefore significantly increased.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
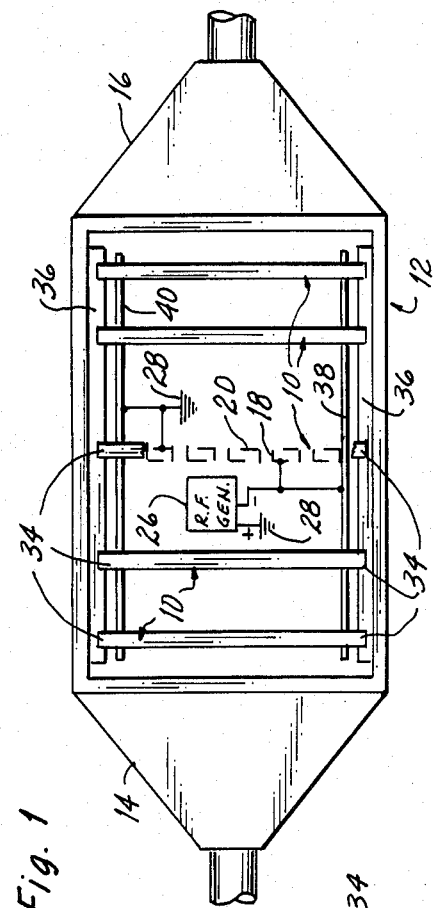
FIG. 1 is a diagrammatic view of a plasma gas chamber having a plurality of electrode pairs of the invention installed therein.

FIG. 1 illustrates a plurality of electrode pairs 10 of the invention installed within a conventional plasma chamber 12 having frustro-pyramidal diffusion chambers 14 and 16 positioned on opposing ends of the chamber 12. Both of the chambers 14 and 16 are connected to the vacuum pump, the supply of gases and other equipment associated with conventional plasma chambers. Each electrode pair 10 of the invention comprises a plurality of power electrode members 18 and a corresponding number of ground electrode members 20. Every two power and ground electrode members 18 and 20 are positioned in facing relationship with one another by means of a plurality of stand-offs 22 and threaded fasteners 24. All of the power electrode members 18 and all of the ground electrode members 20 for the electrode pairs 10 are then respectively connected to the source of electrical energy such as an RF generator 26 and to the ground 28 of the system. When the system is operated, a primary electrical field is created between each of electrode members 18 and 20 of each of the electrode pairs 10 sufficient to excite the gas flowing therethrough to a plasma state. A secondary electrical field is also created between the power electrode members 18 of one electrode pair 10 and the ground electrode members 20 of an adjoining electrode pair 10 which is sufficient to maintain the plasma gas in its excited state.

Figure 2:
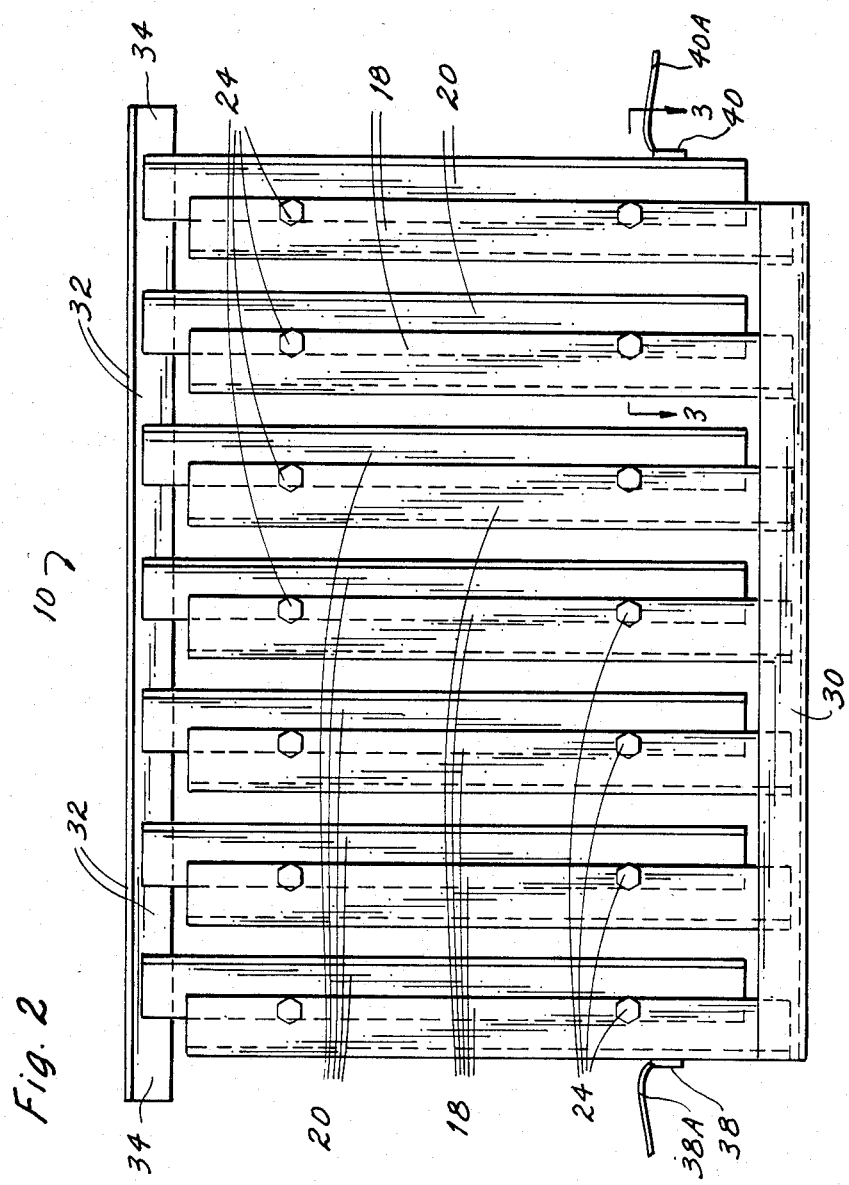
FIG. 2 is a longitudinal view of the first embodiment of the electrode pairs of the invention.
Figure 3:
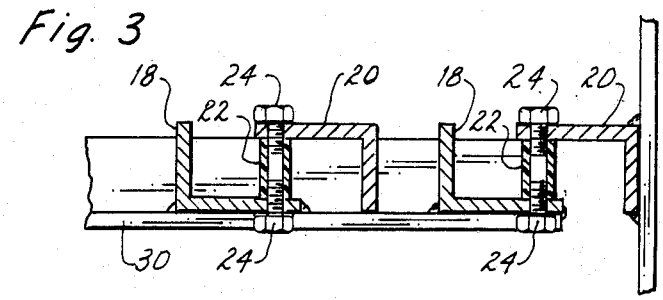
FIG. 3 is a cross-sectional view of FIG. 2 along lines 3—3 illustrating the opposing power and ground electrode members connected together in opposing relationship with one another by means of stand-offs.

More particularly, the first embodiment of electrode pair 10 of the invention is illustrated in FIGS. 2 and 3. In this embodiment, the electrode members 18 and 20 are manufactured from stock angle channels, preferably aluminum or copper. Each two of the electrodes 18 and 20 are positioned in facing relationship with one another and fastened together by means of the stand-offs 22 and threaded fasteners 24. Preferably, the members 18 and 20 are fastened together in the manner illustrated in FIG. 3 with their widest side portions constituting the surface of the electrode pair 10 and with there being uniform spacing between the adjoining members 18 and 20. Experiments have shown that this particular spacing produces the optimal efficiency creating plasma gas through the use of the electrode pair 10 of the invention.

All of the power electrode members 18 of the electrode pair 10 are interconnected by means of a power electrode member bus bar 30. Similarly, all of the ground electrode members 20 of the electrode pair 10 are interconnected by means of a ground electrode member bus bar 32. Preferably, each bus bar 30 and 32 is rigidly fastened to the respective members 18 and 20 by means such as welding. Also, the power electrode member bus bar 30 preferably extends along the bottommost edge of the electrode pair 10 whereas the ground electrode member bus bar 32 preferably extends along the top edge and includes an increased length to define overhanging ends 34. When the electrode pair 10 is inserted into the chamber 12, the electrode pair 10 is suspended from a support member 36 of the chamber 12 by means of the overhanging ends 34. The overhanging ends 34 also provide a good electrical connection to the ground of the chamber 12.

A plurality of the electrode pairs 10 may be interconnected in a spaced-apart relationship to form an assembly of electrode pairs 10. In this regard, a horizontally disposed power electrode pair bus bar 38 and a ground electrode pair bus bar 40 are provided. More specifically, the power bus bar 38 may be rigidly fastened to the outermost power electrode member 18 of each electrode pair 10 by means of welding or the like. Similarly, the ground electrode pair bus bar 40 may be rigidly connected to the outermost ground electrode members 20 (on the opposing ends) of the each electrode pair 10 by means such as welding. The power and ground bus bars 38 and 40 may then be connected to the power and ground of the chamber 12 by suitable wiring 38A and 40A, respectively.

It should be appreciated that the use of the electrode pair bus bars 38 and 40 rigidly secures the plurality of electrode pairs 10 together to form the assembly. The entire assembly may then be inserted within the plasma chamber 12 and connected to the RF generator 26 via connections 38A and 40A or, in the case of the ground, via overhanging ends 34.

Figure 5:
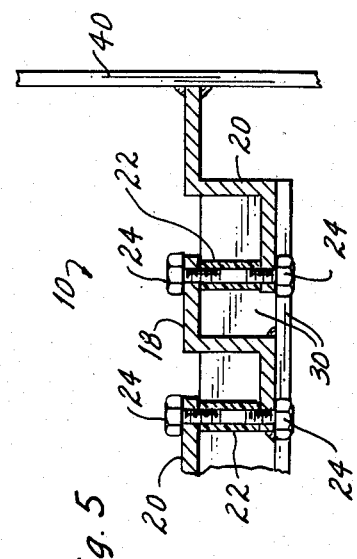
FIG. 5 is a cross-sectional view of FIG. 4 along lines 5—5 illustrating the electrode members connected in opposing relationship with one another by means of stand-offs.
Figure 4:
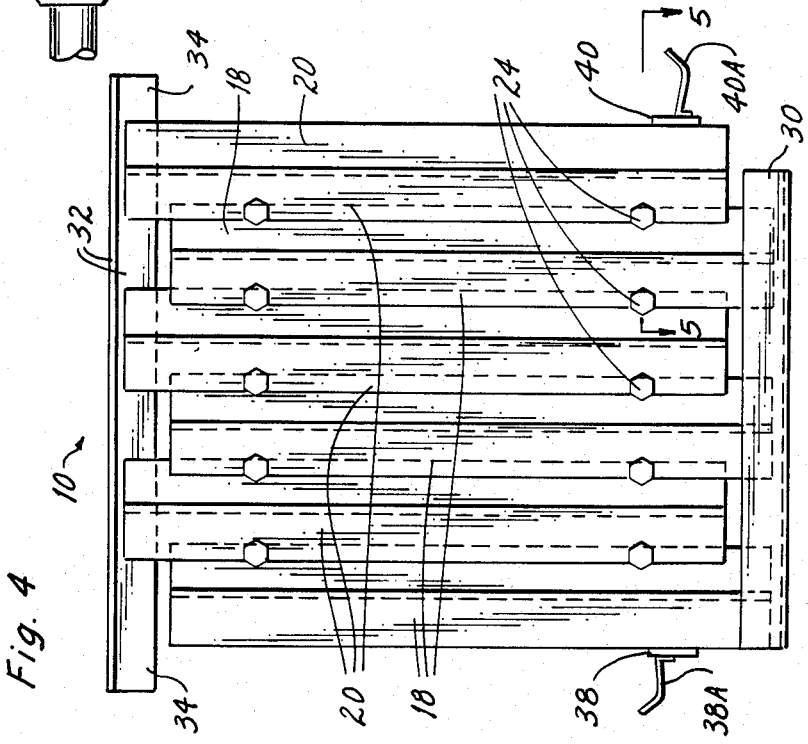
FIG. 4 is a longitudinal view of the second embodiment of the electrode pair of the invention.

FIGS. 4 and 5 illustrate the second embodiment of the electrode pair 10 of the invention which functions similarly to the first embodiment of the electrode pair 10. However, in the second embodiment, the electrode members 18 and 20 are manufactured from stock Z-channel, as illustrated. The Z-channel power electrode members 18 are positioned in opposing relationship by the plurality of stand-offs 22 and threaded fasteners 24.

Without departing from the spirit and scope of this invention, it should be apparent that other configurations of the electrode members 18 and 20 may suffice. Accordingly, for the purpose of the claims appended hereto, the term "electrode member" is not limited to any channel of a particular configuration unless so indicated.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit of the invention.

Now that the invention has been described,

What is claimed is:

1. An electrode pair for plasma chambers, comprising in combination:
    a plurality of power electrode members;
    a plurality of ground electrode members;
    each said electrode members comprising an angle cross-sectional configuration having a wider side portion and a narrower side portion connected along their length in a substantially right angle relationship;
    means for positioning said power electrode members in facing relationship with said ground electrode members with said wider side portions of said power electrode members forming one surface of the electrode pair and the wider portions of the ground electrode members forming the other surface of the electrode pair such that an edge of the respective said wider side portions of adjacent said electrode members overlap one another, said positioning means comprising a plurality of electrically insulative stand-offs fastened to said overlapping edges of the respective said wider side portions of said electrode members;
    means for supplying electrical energy to each of said power electrode members; and
    means for connecting each said ground electrode member to the ground of the plasma chamber.

2. The electrode pair as set forth in claim 1, wherein said means for supplying electrical energy to each of said power electrode members comprises a power electrode member bus bar extending transversely and rigidly connected to each of said power electrode members.

3. The electrode pair as set forth in claim 1, wherein said means for connecting each said ground electrode member to the ground of the plasma chamber comprises a ground electrode member bus bar extending transversely and rigidly connected to each of said ground electrode members.

4. An electrode pair for plasma chambers, comprising in combination:
    a plurality of power electrode members;
    a plurality of ground electrode members;
    said electrode members comprising a "Z" cross-sectional configuration having a pair of wider side portions positioned substantially parallel to one another and interconnected along their length by means of a narrower interconnecting portion to define a substantially "Z" relationship;

means for positioning said power electrode members in facing relationship with said ground electrode members with said wider side portions of said electrode members forming the surfaces of the electrode pair such that an edge of the respective said wider side portions of adjacent said electrode members overlap one another, said positioning means comprising a plurality of electrically insulative stand-offs fastened to said overlapping edges of the respective said wider side portions of said electrode members;

means for supplying electrical energy to each of said power electrode members; and means for connecting each said ground electrode member to the ground of the plasma chamber.

5. The electrode pair as set forth in claim 4, wherein said means for supplying electrical energy to each of said power electrode members comprises a power electrode member bus bar extending transversely and rigidly connected to each of said power electrode members.

6. The electrode pair as set forth in claim 4, wherein said means for connecting each said ground electrode member to the ground of the plasma chamber comprises a ground electrode member bus bar extending transversely and rigidly connected to each of said ground electrode members.

7. An electrode pair for plasma chambers, comprising in combination:

a plurality of power electrode members;

a plurality of ground electrode members;

said electrode members having a side portion and an intermediate portion angularly positioned relative to one another;

means for positioning said power electrode members in facing relationship with said ground electrode members with said side portions of said electrode members forming a surface of the electrode pair such that an edge of the respective said side portions of adjacent said electrode members overlap one another, said positioning means comprising a plurality of electrically insulating stand-offs fastened to said overlapping edges of the respective said side portions of said electrode members;

means for supplying electrical energy to each of said power electrode members; and means for connecting each said ground electrode member to the ground of the plasma chamber.

8. The electrode pair as set forth in claim 7, wherein said means for supplying electrical energy to each of said power electrode members comprises a power electrode member bus bar extending transversely and rigidly connected to each of said power electrode members.

9. The electrode pair as set forth in claim 7, wherein said means for connecting each said ground electrode member to the ground of the plasma chamber comprises a ground electrode member bus bar extending transversely and rigidly connected to each of said ground electrode members.

* * * * *